US011183858B2

(12) United States Patent
Takeda

(10) Patent No.: US 11,183,858 B2
(45) Date of Patent: Nov. 23, 2021

(54) RECHARGEABLE BATTERY PROTECTION CIRCUIT, RECHARGEABLE BATTERY PROTECTION DEVICE, BATTERY PACK, AND METHOD OF CONTROLLING RECHARGEABLE BATTERY PROTECTION CIRCUIT

(71) Applicant: Takashi Takeda, Tokyo (JP)

(72) Inventor: Takashi Takeda, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 206 days.

(21) Appl. No.: 16/455,981

(22) Filed: Jun. 28, 2019

(65) Prior Publication Data

US 2020/0076209 A1    Mar. 5, 2020

(30) Foreign Application Priority Data

Aug. 31, 2018    (JP) .............................. JP2018-162647

(51) Int. Cl.
| H02J 7/00 | (2006.01) |
| H01M 10/42 | (2006.01) |
| H01M 10/48 | (2006.01) |
| H03K 17/687 | (2006.01) |

(52) U.S. Cl.
CPC ......... *H02J 7/0026* (2013.01); *H01M 10/425* (2013.01); *H01M 10/48* (2013.01); *H02J 7/0047* (2013.01); *H03K 17/687* (2013.01); *H02J 7/0048* (2020.01); *H02J 7/0049* (2020.01); *H02J 2207/10* (2020.01)

(58) Field of Classification Search
CPC ...... H02J 7/0026; H02J 7/0047; H02J 7/0048; H02J 7/0049; H02J 2207/10; H01M 10/425; H01M 10/48; H03K 17/687

USPC .......................................................... 320/107
See application file for complete search history.

(56) References Cited

U.S. PATENT DOCUMENTS

| 5,783,322 A | * | 7/1998 | Nagai | ................... | H01M 10/48 |
| | | | | | 429/7 |
| 10,122,188 B2 | * | 11/2018 | Eo | ......................... | H02J 7/0072 |

FOREIGN PATENT DOCUMENTS

| JP | H09-140066 | 5/1997 |
| JP | 2005-318303 | 11/2005 |
| JP | 2005318303 | * 11/2005 |

OTHER PUBLICATIONS

Japanese office action for JP2018-162647 dated Oct. 30, 2018.

* cited by examiner

*Primary Examiner* — Nathaniel R Pelton
(74) *Attorney, Agent, or Firm* — IPUSA, PLLC

(57) ABSTRACT

A rechargeable battery protection circuit protects a rechargeable battery, using two NMOS transistors inserted in series in a current path between a battery cathode and a positive terminal connected to load or power terminal of a charger. The protection circuit includes a booster circuit that generates a control voltage, using input capacitances of the NMOS transistors having gates connected to charge and discharge control terminals, respectively. A driving circuit sets the output state of the control terminals to a high level, by supplying the control voltage to the control terminals, a detection circuit detects a battery state and outputs a detection state, and a control circuit operates the driving circuit based on the detection state, so that the output state of the control terminals is selected by the driving circuit to at least one of three states including a high level, a low level, and a high-impedance state.

15 Claims, 10 Drawing Sheets

| EN | IN | OUT |
|---|---|---|
| 0 | 0 | 0 |
| 0 | 1 | 1 |
| 1 | 0 | HiZ |
| 1 | 1 | HiZ |

| EN | IN | OUT |
|---|---|---|
| 0 | 0 | 0 |
| 0 | 1 | 1 |
| 1 | 0 | 0 |
| 1 | 1 | HiZ |

RECHARGEABLE BATTERY PROTECTION CIRCUIT, RECHARGEABLE BATTERY PROTECTION DEVICE, BATTERY PACK, AND METHOD OF CONTROLLING RECHARGEABLE BATTERY PROTECTION CIRCUIT

CROSS-REFERENCE TO RELATED APPLICATIONS

This application is based on and claims priority to Japanese Patent Application No. 2018-162647 filed on Aug. 31, 2018, the entire contents of which are incorporated herein by reference.

BACKGROUND OF THE INVENTION

1. Field of the Invention

The present invention relates to a rechargeable battery (or secondary battery) protection circuit, a rechargeable battery protection device, a battery pack, and a method of controlling the rechargeable battery protection circuit.

2. Description of the Related Art

Conventionally, there is a known protection circuit which protects a rechargeable battery using a pair of N-channel Metal Oxide Semiconductor (NMOS) transistors, inserted in series in a current path, between a cathode of the rechargeable battery and a positive terminal that is connected to a load or to a power terminal of a charger. Such a protection circuit is provided with a booster circuit which generates a boosted control voltage utilizing each input capacitance of the pair of NMOS transistors. An example of such a protection circuit is proposed in Japanese Laid-Open Patent Publication No. 2005-318303, for example.

However, the NMOS transistor may not operate as intended, depending on a timing with which a charge accumulated in the input capacitance of the NMOS transistor is transferred.

SUMMARY OF THE INVENTION

Embodiments of the present invention can provide a rechargeable battery protection circuit, a rechargeable battery protection device, a battery pack, and a method of controlling the rechargeable battery protection circuit, which can prevent unintended operation of the NMOS transistor.

According to one aspect of embodiments of the present invention, a rechargeable battery protection circuit, which protects a rechargeable battery, using a first NMOS transistor and a second NMOS transistor inserted in series in a current path between a cathode of the rechargeable battery and a positive terminal that is coupled to a load or a power terminal of a charger, includes a charge control terminal; a discharge control terminal; a booster circuit configured to generate a control voltage that is boosted, using each of input capacitances of the first NMOS transistor having a gate coupled to the charge control terminal, and the second NMOS transistor having a gate coupled to the discharge control terminal; a driving circuit configured to set each of output states of the charge control terminal and the discharge control terminal to a high level, by supplying the control voltage to the charge control terminal and the discharge control terminal; a detection circuit configured to detect a state of the rechargeable battery, and output a detection state; and a control circuit configured to operate the driving circuit based on the detection state, so that each of the output states of the charge control terminal and the discharge control terminal is selected by the driving circuit to at least one of three states including a high level, a low level, and a high-impedance state.

According to one aspect of embodiments of the present invention, a rechargeable battery protection device includes a first NMOS transistor inserted in series in a current path between a cathode of a rechargeable battery and a positive terminal that is coupled to a load or a power terminal of a charger; a second NMOS transistor inserted in series in the current path; and a rechargeable battery protection circuit configured to protect the rechargeable battery, using the first NMOS transistor and the second NMOS transistor, wherein the rechargeable battery protection circuit includes a charge control terminal; a discharge control terminal; a booster circuit configured to generate a control voltage that is boosted, using each of input capacitances of the first NMOS transistor having a gate coupled to the charge control terminal, and the second NMOS transistor having a gate coupled to the discharge control terminal; a driving circuit configured to set each of output states of the charge control terminal and the discharge control terminal to a high level, by supplying the control voltage to the charge control terminal and the discharge control terminal; a detection circuit configured to detect a state of the rechargeable battery, and output a detection state; and a control circuit configured to operate the driving circuit based on the detection state, so that each of the output states of the charge control terminal and the discharge control terminal is selected by the driving circuit to at least one of three states including a high level, a low level, and a high-impedance state.

According to one aspect of embodiments of the present invention, a battery pack includes a first NMOS transistor inserted in series in a current path between a cathode of a rechargeable battery and a positive terminal that is coupled to a load or a power terminal of a charger; a second NMOS transistor inserted in series in the current path; and a rechargeable battery protection circuit configured to protect the rechargeable battery, using the first NMOS transistor and the second NMOS transistor, wherein the rechargeable battery protection circuit includes a charge control terminal; a discharge control terminal; a booster circuit configured to generate a control voltage that is boosted, using each of input capacitances of the first NMOS transistor having a gate coupled to the charge control terminal, and the second NMOS transistor having a gate coupled to the discharge control terminal; a driving circuit configured to set each of output states of the charge control terminal and the discharge control terminal to a high level, by supplying the control voltage to the charge control terminal and the discharge control terminal; a detection circuit configured to detect a state of the rechargeable battery, and output a detection state; and a control circuit configured to operate the driving circuit based on the detection state, so that each of the output states of the charge control terminal and the discharge control terminal is selected by the driving circuit to at least one of three states including a high level, a low level, and a high-impedance state.

According to one aspect of embodiments of the present invention, a method of controlling a rechargeable battery protection circuit which protects a rechargeable battery, using a first NMOS transistor and a second NMOS transistor inserted in series in a current path between a cathode of the rechargeable battery and a positive terminal that is coupled to a load or a power terminal of a charger, wherein the rechargeable battery protection circuit includes a charge control terminal; a discharge control terminal; a booster circuit configured to generate a control voltage that is boosted, using each of input capacitances of the first NMOS transistor having a gate coupled to the charge control terminal, and the second NMOS transistor having a gate coupled to the discharge control terminal; a driving circuit configured to set each of output states of the charge control terminal and the discharge control terminal to a high level, by supplying the control voltage to the charge control terminal and the discharge control terminal; and a detection circuit configured to detect a state of the rechargeable battery, and output a detection state, includes operating the driving circuit based on the detection state, so that each of the output states of the charge control terminal and the discharge control terminal is selected by the driving circuit to at least one of three states including a high level, a low level, and a high-impedance state.

Other objects and further features of the present invention will be apparent from the following detailed description when read in conjunction with the accompanying drawings.

DESCRIPTION OF THE PREFERRED EMBODIMENTS

Figure 1:
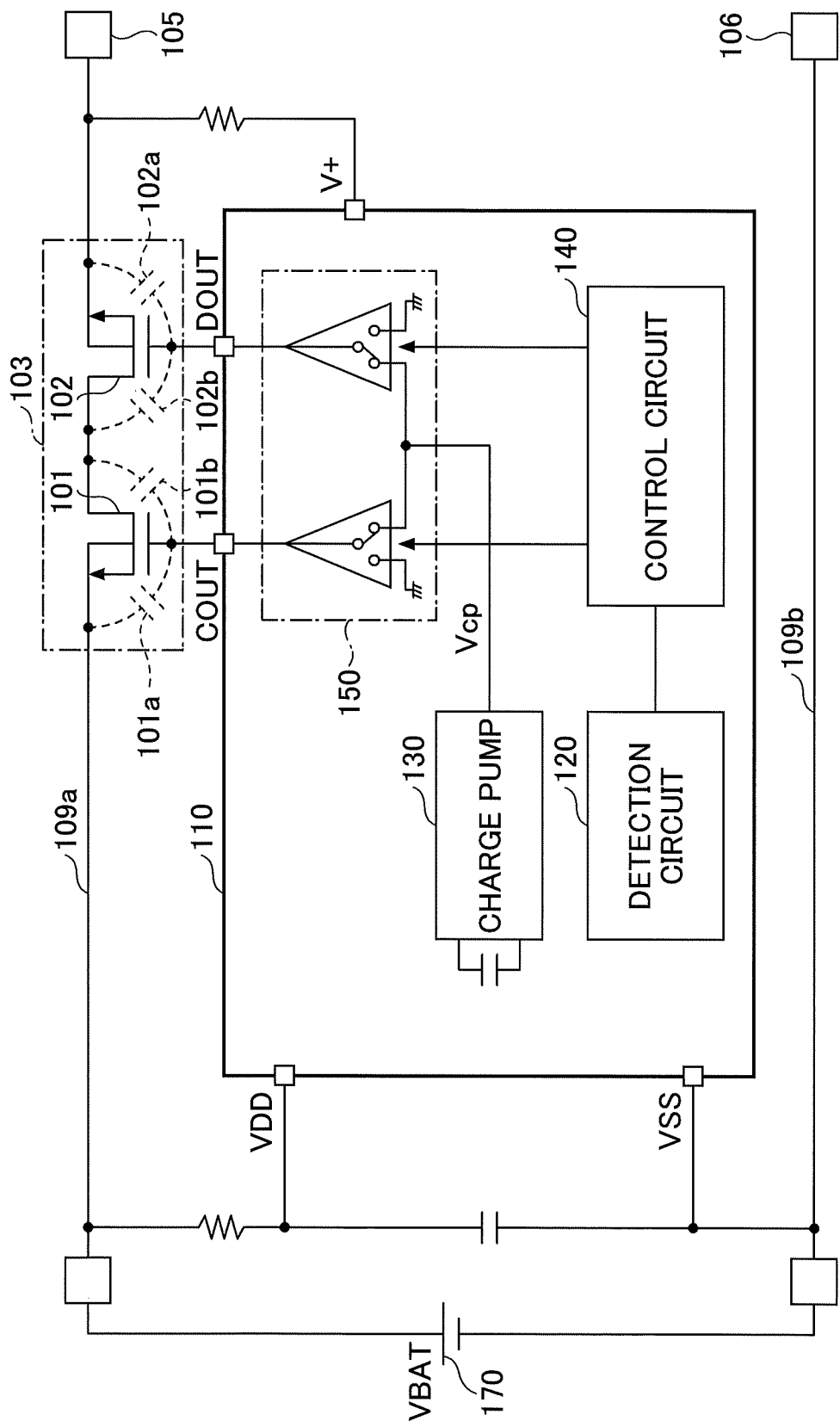
FIG. 1 is a diagram illustrating a configuration of a rechargeable battery protection circuit according to one comparison example.

Embodiments of the present invention will be described, by referring to the drawings. First, before describing configurations according to one embodiment of the present invention, a configuration according to one comparison example, which is an example of "related art", will be described for enabling comparison to one embodiment of the present invention.

FIG. 1 is a diagram illustrating a configuration of a rechargeable battery protection circuit according to one comparison example. A protection circuit 110 illustrated in FIG. 1 protects a rechargeable battery 170 from overdischarge or the like, using a pair of NMOS transistors which will be described later, inserted in series in a current path 109a between a cathode of the rechargeable battery 170 and a positive terminal 105. The positive terminal 105 is connected to a load (not illustrated) or to a power terminal of a charger (not illustrated).

The rechargeable battery 170 supplies power to the load, which is not illustrated and is connected to the positive terminal 105 and a negative terminal 106. In addition, the rechargeable battery 170 may be charged by the charger, which is not illustrated and is connected to the positive terminal 105 and the negative terminal 106.

The cathode of the rechargeable battery 170 and the positive terminal 105 are connected via a positive-side current path 109a, and an anode of the rechargeable battery 170 and the negative terminal 106 are connected via a negative-side current path 109b. A switching circuit 103 is inserted in series in the positive-side current path 109a.

The switching circuit 103 includes a charge control transistor 101 having a gate that is connected to a COUT-terminal, and a discharge control transistor 102 having a gate that is connected to a DOUT-terminal, for example. The charge control transistor 101 and the discharge control transistor 102 are both NMOS transistors. The charge control transistor 101 includes an input capacitance 101a that is gate-source parasitic, and an input capacitance 101b that is gate-drain parasitic. The discharge control transistor 102 includes an input capacitance 102a that is gate-source parasitic, and an input capacitance 102b that is gate-drain parasitic.

The protection circuit 110 protects the rechargeable battery 170 from charge abnormalities such as overcharge or the like by turning off the charge control transistor 101, and protects the rechargeable battery 170 from discharge abnormalities such as overdischarge or the like, and short-circuit abnormalities by turning off the discharge control transistor 102. The protection circuit 110 is an Integrated Circuit (IC) including a detection circuit 120, a charge pump 130, a driving circuit 150, and a control circuit 140.

The detection circuit 120 monitors a power supply voltage Vd, which is a voltage between a VDD terminal and a VSS terminal. Because the VDD terminal is connected to the cathode of the rechargeable battery 170, and the VSS terminal is connected to the anode of the rechargeable battery 170, the power supply voltage Vd is approximately equal to a cell voltage VBAT of the rechargeable battery 170. Accordingly, the detection circuit 120 can detect the cell voltage VBAT of the rechargeable battery 170 by monitoring the power supply voltage Vd.

When the power supply voltage Vd lower than a predetermined overdischarge detection voltage Vdet2 is detected by the detection circuit 120, for example, the detection circuit 120 outputs an overdischarge detection signal indicating that the power supply voltage Vd lower than the overdischarge detection voltage Vdet2 is detected. In addition, when the power supply voltage Vd higher than a predetermined overdischarge return voltage Vrel2 is detected by the detection circuit 120, for example, the detection circuit 120 outputs an overdischarge return detection signal indicating that the power supply voltage Vd higher than the predetermined overdischarge return voltage Vrel2 is detected. The overdischarge detection voltage Vdet2 is a threshold value for overdischarge detection, and the overdischarge return voltage Vrel2 is a threshold value for overdischarge return detection. The overdischarge return voltage Vrel2 is set to a voltage value higher than the overdischarge detection voltage Vdet2.

The charge pump 130 is a booster circuit which generates a boosted control voltage Vcp by utilizing the input capacitances 101a, 101b, 102a, and 102b of the charge control transistor 101 and the discharge control transistor 102, as output capacitances of the charge pump 130. The charge pump 130 boosts the power supply voltage Vd, and generates the control voltage Vcp having a voltage value higher than the power supply voltage Vd. The charge pump 130 may have a known configuration, such as the circuit configuration proposed in Japanese Laid-Open Patent Publication No. 2005-318303, for example.

The driving circuit 150 uses the control voltage Vcp, to output from the COUT-terminal a signal which turns on the charge control transistor 101, and to output from the DOUT-terminal a signal which turns on the discharge control transistor 102. The driving circuit 150 supplies the control voltage Vcp to the COUT-terminal to set an output state of the COUT-terminal to a high level. On the other hand, the driving circuit 150 supplies the control voltage Vcp to the DOUT-terminal to set an output state of the DOUT-terminal to a high level.

When an overcharge or charge overcurrent of the rechargeable battery 170 is detected by the detection circuit 120, the control circuit 140 operates the driving circuit 150 so that the output state of the COUT-terminal changes from the high level to a low level after a predetermined delay time elapses. When the output state of the COUT-terminal becomes the low level, the charge control transistor 101 turns off, and a current is prohibited from flowing in the current path 109a in a direction to charge the rechargeable battery 170. Hence, the charge of the rechargeable battery 170 stops, and the rechargeable battery 170 can be protected from the overcharge or charge overcurrent.

On the other hand, when an overdischarge or discharge overcurrent of the rechargeable battery 170 is detected by the detection circuit 120, the control circuit 140 operates the driving circuit 150 so that the output state of the DOUT-terminal changes from the high level to a low level after a predetermined delay time elapses. When the output state of the DOUT-terminal becomes the low level, the discharge control transistor 102 turns off, and a current is prohibited from flowing in the current path 109a in a direction to discharge the rechargeable battery 170. Hence, the discharge of the rechargeable battery 170 stops, and the rechargeable battery 170 can be protected from the overdischarge or discharge overcurrent.

Figure 2:
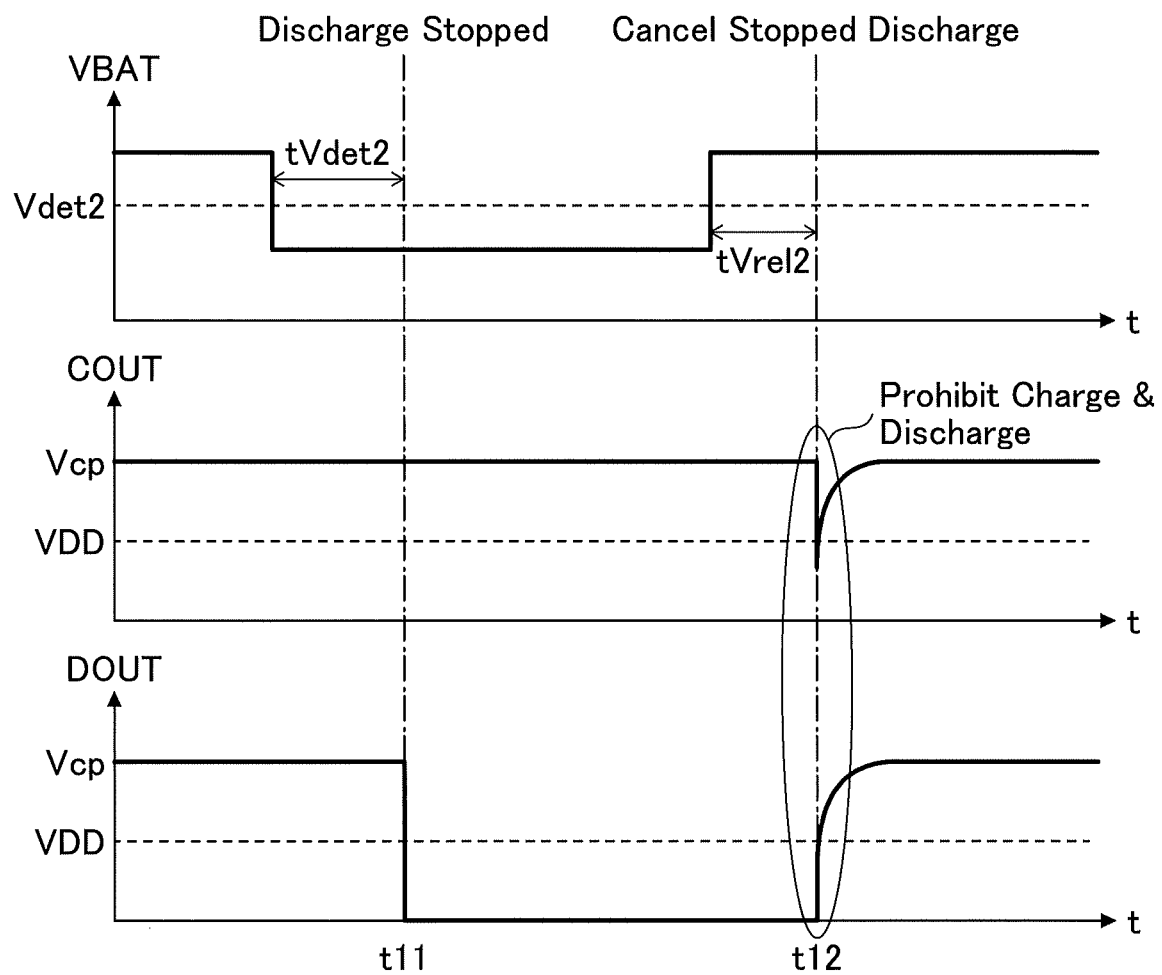
FIG. 2 is a timing chart for explaining an operation of the rechargeable battery protection circuit according to one comparison example.

FIG. 2 is a timing chart for explaining an operation of the protection circuit 110 illustrated in FIG. 1. FIG. 2 illustrates a process, from a time when the overdischarge of the rechargeable battery 170 is detected by the detection circuit 120 and the discharge of the rechargeable battery 170 is stopped, to a time when the return from the overdischarge of the rechargeable battery 170 is detected by the detection circuit 120 and the stopped discharge of the rechargeable battery 170 is canceled. In FIG. 2, t denotes the time in arbitrary units.

When the power supply voltage Vd (approximately equal to the cell voltage VBAT) lower than the predetermined overdischarge detection voltage Vdet2 is detected by the detection circuit 120, the control circuit 140 judges whether a predetermined overdischarge detection delay time tVdet2 has elapsed from a time when the power supply voltage Vd lower than the predetermined overdischarge detection voltage Vdet2 is detected by the detection circuit 120. When the power supply voltage Vd lower than the predetermined overdischarge detection voltage Vdet2 is continuously detected by the detection circuit 120 until the predetermined overdischarge detection delay time tVdet2 elapses, the control circuit 140 operates the driving circuit 150 so that the output state of the DOUT-terminal changes from the high level to the low level. Because the output state of the DOUT-terminal changes to the low level after a timing t11, the discharge control transistor 102 changes from an on state to an off state, and the discharge of the rechargeable battery 170 stops. In this case, the control circuit 140 operates the driving circuit 150 so that the gate of the discharge control transistor 102 is disconnected from the charge pump 130, and the charges accumulated in the input capacitances 102a and 102b of the discharge control transistor 102 are discharged to the ground.

Thereafter, when the power supply voltage Vd (approximately equal to the cell voltage VBAT) higher than the predetermined overdischarge return voltage Vrel2 is detected by the detection circuit 120, the control circuit 140 judges whether a predetermined overdischarge return delay time tVrel2 has elapsed from a time when the power supply voltage Vd higher than the predetermined overdischarge return voltage Vrel2 is detected by the detection circuit 120. When the power supply voltage Vd higher than the predetermined overdischarge return voltage Vrel2 is continuously detected by the detection circuit 120 until the predetermined overdischarge return delay time tVrel2 elapses, the control circuit 140 operates the driving circuit 150 so that the output state of the DOUT-terminal changes from the low level to the high level. Because the output state of the DOUT-terminal changes to the high level after a timing t12, the discharge control transistor 102 changes from an off state to an on state, and the stopped discharge of the rechargeable battery 170 is canceled. In this case, the control circuit 140 operates the driving circuit 150 so that the gate of the discharge control transistor 102 is reconnected to the charge pump 130, and the charges accumulated in the input capacitances 102a and 102b of the discharge control transistor 102 are charged by the control voltage Vcp.

However, at the timing t12, half of the charges accumulated in the input capacitances 101a and 101b of the charge control transistor 101 is instantaneously transferred to the input capacitances 102a and 102b of the discharge control transistor 102. Consequently, the voltage at the COUT-terminal and the voltage at the DOUT-terminal instantaneously become approximately equal to the power supply voltage Vd. As a result, the gate-source voltage of the charge control transistor 101 drops from the power supply voltage Vd to approximately zero, to turn off the charge control transistor 101, and the charge and discharge are instantaneously prohibited at the timing t12. In other words, an unintended operation (that is, an instantaneous off operation) of the charge control transistor 101 occurs.

FIG. 2 illustrates the unintended operation of the charge control transistor 101 that occurs when the output state of the DOUT-terminal changes from the low level to the high level in a high-level state of the COUT-terminal. However, an unintended operation of the discharge control transistor 102 similarly occurs when the output state of the COUT-terminal changes from the low level to the high level in a high-level state of the DOUT-terminal.

Figure 3:
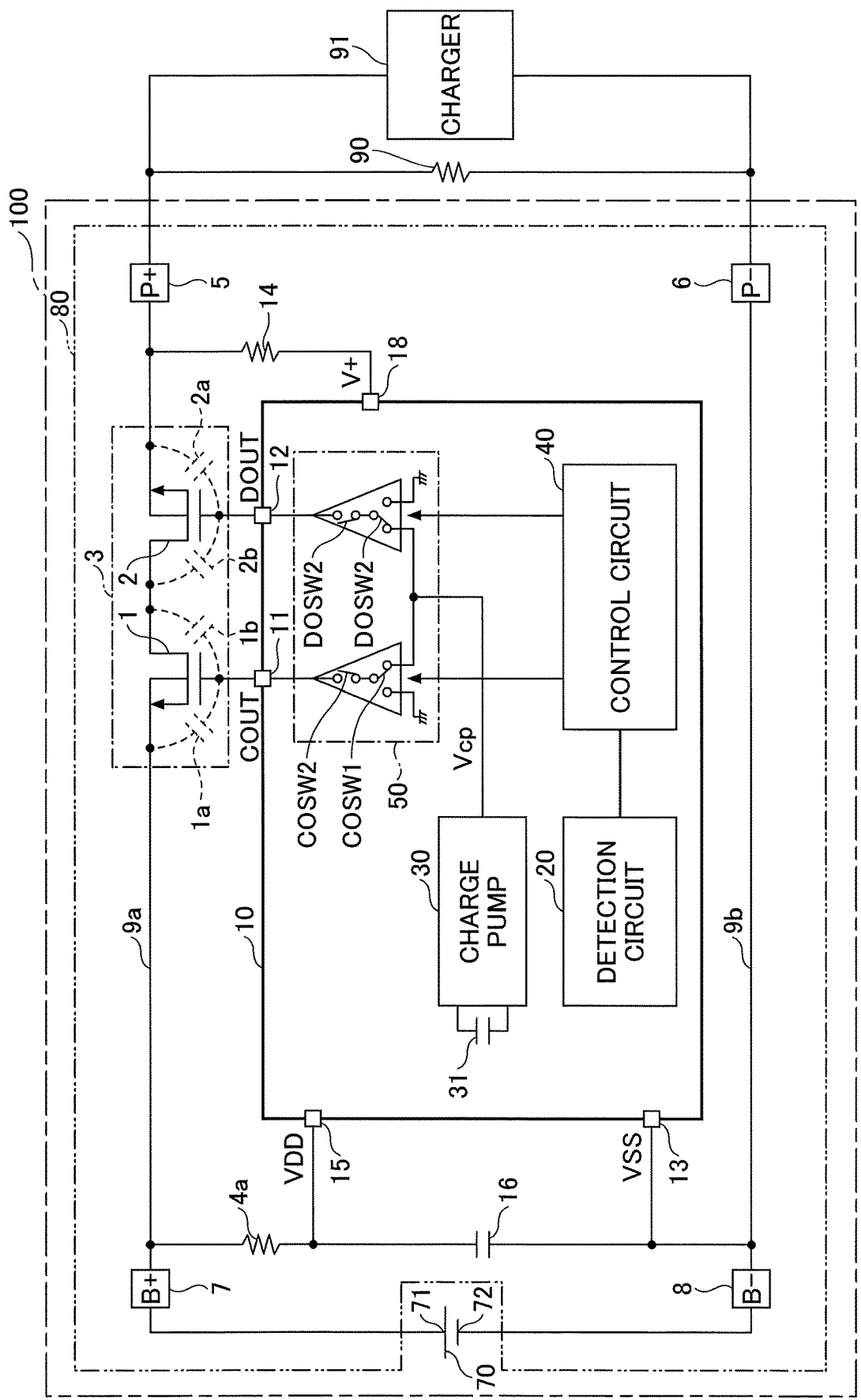
FIG. 3 is a diagram illustrating a configuration of a battery pack including a rechargeable battery protection circuit according to one embodiment.

On the other hand, a battery protection circuit 10 according to one embodiment of the present invention illustrated in FIG. 3 includes a control circuit 40 which selects the output state of each of the COUT-terminal and the DOUT-terminal to one of at least three states including a high level, a low level, and a high-impedance state. In other words, the battery protection circuit 10 is configured to control the output state of each of the COUT-terminal and the DOUT-terminal to the high impedance state. By controlling the output state of a control terminal that is connected to the gate of one of the pair of NMOS transistors to the high-impedance state, it is possible to prevent the charges accumulated in each input capacitance of the one of the pair of NMOS transistors from being transferred to each input capacitance of the other of the pair of NMOS transistors. Accordingly, it is possible prevent an unintended operation (that is, the instantaneous off operation) of the other of the pair of NMOS transistors.

Next, one embodiment of the present invention will be described in more detail.

FIG. 3 is a diagram illustrating a configuration of a battery pack according to one embodiment. A battery pack 100 illustrated in FIG. 3 may include a rechargeable battery 70 and a battery protection device 80, which may be built-in elements.

The rechargeable battery 70 is an example of a battery which is chargeable and dischargeable. The rechargeable battery 70 supplies power to a load 90 that is connected to a positive terminal 5 (P+ terminal) and a negative terminal 6 (P− terminal). The rechargeable battery 70 may be charged by a charger 91 that is connected to the positive terminal 5 and the negative terminal 6. Examples of the rechargeable battery 70 include lithium ion batteries, lithium polymer batteries, or the like. The battery pack 100 may be built-in to the load 90, or may be externally connected to the load 90.

The load 90 is an example of a load which uses the rechargeable battery 70 of the battery pack 100 as the power supply. Examples of the load 90 include electric apparatuses such as electric tools or the like, and electronic apparatuses such as mobile terminal apparatuses or the like that are portable. Examples of the electronic apparatuses include mobile phones, smartphones, computers, game apparatuses, television sets, cameras, or the like. However, the load 90 is of course not limited to such electronic apparatuses.

The battery protection device 80 is an example of a rechargeable battery protection device which operates using the rechargeable battery 70 as the power supply, and the rechargeable battery 70 can be protected from overcharge, overdischarge, or the like by controlling the charge and discharge or the rechargeable battery 70. The battery protection device 80 includes the positive terminal 5 (P+ terminal), the negative terminal 6 (P− terminal), a cathode terminal 7 (B+ terminal), an anode terminal 8 (B− terminal), a switching circuit 3, and the battery protection circuit 10.

The positive terminal 5 is an example of a terminal to which the load 90 or a power terminal of the charger 91 may be connected. The negative terminal 6 is an example of a terminal to which the load 90 or the ground of the charger 91 may be connected. The cathode terminal 7 is an example of a terminal for connecting a positive-side current path 9a to a cathode 71 of the rechargeable battery 70, and the anode terminal 8 is an example of a terminal for connecting a negative-side current path 9b to an anode 72 of the rechargeable battery 70.

The cathode 71 of the rechargeable battery 70 and the positive terminal 5 are connected via the positive-side current path 9a, and the anode 72 of the rechargeable battery 70 and the negative terminal 6 are connected via the nega-tive-side current path 9b. The positive-side current path 9a is an example of a charge and discharge current path between the cathode 71 of the rechargeable battery 70 and the positive terminal 5, and the negative-side current path 9b is an example of a charge and discharge current path between the anode 72 of the rechargeable battery 70 and the negative terminal 6.

The switching circuit 3 is inserted in series in the positive-side current path 9a between the cathode 71 of the rechargeable battery 70 and the positive terminal 5 to which the load 90 or the power terminal of the charger 91 may be connected.

The switching circuit 3 includes a charge control transistor 1 and a discharge control transistor 2, for example. The charge control transistor 1 is an example of a charge path cutoff part which cuts off a charge path of the rechargeable battery 70, and the discharge control transistor 2 is an example of a discharge path cutoff part which cuts off a discharge path of the rechargeable battery 70. According to the configuration illustrated in FIG. 3, the charge control transistor 1 cuts off the current path 9a through which the charge current of the rechargeable battery 70 flows, and the discharge control transistor 2 cuts off the current path 9a through which the discharge current of the rechargeable battery 70 flows. The transistors 1 and 2 are switching elements that switch conducting and cutoff states of the current path 9a, and are inserted in series in the current path 9a. The transistors 1 and 2 are NMOS transistors, for example.

The charge control transistor 1 includes an input capacitance 1a that is gate-source parasitic, and an input capacitance 1b that is gate-drain parasitic. The discharge control transistor 2 includes an input capacitance 2a that is gate-source parasitic, and an input capacitance 2b that is gate-drain parasitic.

The battery protection circuit 10 is an example of a rechargeable battery protection circuit. The battery protection circuit 10 performs protection operation on the rechargeable battery 70, by turning off the switching circuit 3. The battery protection circuit 10 is an Integrated Circuit (IC) that operates at a battery voltage (hereinafter also referred to as a "cell voltage") between the cathode 71 and the anode 72 of the rechargeable battery 70. The battery protection circuit 10 includes a charge control terminal 11 (COUT-terminal), a discharge control terminal 12 (DOUT-terminal), a monitor terminal 18 (V+ terminal), a power terminal 15 (VDD terminal), and a ground terminal 13 (VSS terminal).

The COUT-terminal is connected to the gate of the charge control transistor 1, and outputs a signal which turns on or off the charge control transistor 1. The DOUT-terminal is connected to the gate of the discharge control transistor 2, and outputs a signal which turns on or off the discharge control transistor 2.

The V+ terminal is used to monitor a potential of the positive terminal 5, and is connected to the positive terminal 5. The V+ terminal is used by the control circuit 40 to monitor whether the load 90 or the charger 91 is connected, and is connected to the positive-side current path 9a via a resistor 14 between the positive terminal 5 and the transistors 1 and 2.

The VDD terminal is a power terminal of the battery protection circuit 10, and is connected to the cathode 71 of the rechargeable battery 70 and the positive-side current path 9a. The VSS terminal is a ground terminal of the battery protection circuit 10, and is connected to the anode 72 of the rechargeable battery 70 and the negative-side current path 9b. A series circuit made up of a resistor 4a and a capacitor 16 is connected between the positive-side current path 9a and the negative-side current path 9b, so as to be connected in parallel to the rechargeable battery 70. Because the VDD terminal is connected to a node between the resistor 4a and the capacitor 16, it is possible to reduce potential fluctuation at the VDD terminal.

The battery protection circuit 10 protects the rechargeable battery 70 from charge abnormalities such as overcharge or the like by turning off the charge control transistor 1, and protects the rechargeable battery 70 from discharge abnormalities such as overdischarge or the like, and short-circuit abnormalities by turning off the discharge control transistor 2. The battery protection circuit 10 is an Integrated Circuit (IC) including a detection circuit 20, a charge pump 30, a driving circuit 50, and a control circuit 40.

The detection circuit 20 detects the state of the rechargeable battery 70, and outputs a detection state. The detection circuit 20 monitors a power supply voltage Vd, which is a voltage between the VDD terminal and the VSS terminal. Because the VDD terminal is connected to the cathode 71 of the rechargeable battery 70, and the VSS terminal is connected to the anode of the rechargeable battery 70, the power supply voltage Vd is approximately equal to a cell voltage VBAT of the rechargeable battery 70. Accordingly, the detection circuit 20 can detect the cell voltage VBAT of the rechargeable battery 70, by monitoring the power supply voltage Vd. In addition, the detection circuit 20 monitors a monitor voltage V+, which is a voltage of the V+ terminal that uses the VDD terminal for a reference potential.

When the power supply voltage Vd higher than a predetermined overcharge detection voltage Vdet1 is detected by the detection circuit 20, for example, the detection circuit 20 outputs an overcharge detection signal indicating that the power supply voltage Vd higher than the overcharge detection voltage Vdet1 is detected. In addition, when the power supply voltage Vd higher than a predetermined overcharge return voltage Vrel1 is detected by the detection circuit 20, for example, the detection circuit 20 outputs an overcharge return detection signal indicating that the power supply voltage Vd higher than the predetermined overcharge return voltage Vrel1 is detected. The overcharge detection voltage Vdet1 is a threshold value for overcharge detection, and the overcharge return voltage Vrel1 is a threshold value for overcharge return detection. The overcharge return voltage Vrel1 is set to a voltage value lower than the overcharge detection voltage Vdet1.

When the power supply voltage Vd lower than a predetermined overdischarge detection voltage Vdet2 is detected by the detection circuit 20, for example, the detection circuit 20 outputs an overdischarge detection signal indicating that the power supply voltage Vd lower than the overdischarge detection voltage Vdet2 is detected. In addition, when the power supply voltage Vd higher than a predetermined overdischarge return voltage Vrel2 is detected by the detection circuit 20, for example, the detection circuit 20 outputs an overdischarge return detection signal indicating that the power supply voltage Vd higher than the predetermined overdischarge return voltage Vrel2 is detected. The overdischarge detection voltage Vdet2 is a threshold value for overdischarge detection, and the overdischarge return voltage Vrel2 is a threshold value for overdischarge return detection. The overdischarge return voltage Vrel2 is set to a voltage value higher than the overdischarge detection voltage Vdet2.

When the monitor voltage V+ lower than a predetermined discharge overcurrent detection voltage Vdet3 is detected by the detection circuit 20, for example, the detection circuit 20 outputs a discharge overcurrent detection signal indicating that the monitor voltage V+ lower than the discharge overcurrent detection voltage Vdet3 is detected. In addition, when the monitor voltage V+ higher than a predetermined discharge overcurrent return voltage Vrel3 is detected by the detection circuit 20, for example, the detection circuit 20 outputs a discharge overcurrent return detection signal indicating that the monitor voltage V+ higher than the predetermined discharge overcurrent return voltage Vrel3 is detected. The discharge overcurrent detection voltage Vdet3 is a threshold value for discharge overcurrent detection, and the discharge overcurrent return voltage Vrel3 is a threshold value for discharge overcurrent return detection. The discharge overcurrent return voltage Vrel3 is set to a voltage value higher than the discharge overcurrent detection voltage Vdet3.

When the monitor voltage V+ higher than a predetermined charge overcurrent detection voltage Vdet4 is detected by the detection circuit 20, for example, the detection circuit 20 outputs an charge overcurrent detection signal indicating that the monitor voltage V+ higher than the charge overcurrent detection voltage Vdet4 is detected. In addition, when the monitor voltage V+ lower than a predetermined charge overcurrent return voltage Vrel4 is detected by the detection circuit 20, for example, the detection circuit 20 outputs a charge overcurrent return detection signal indicating that the monitor voltage V+ lower than the predetermined charge overcurrent return voltage Vrel4 is detected. The charge overcurrent detection voltage Vdet4 is a threshold value for charge overcurrent detection, and the charge overcurrent return voltage Vrel4 is a threshold value for charge overcurrent return detection. The charge overcurrent return voltage Vrel4 is set to a voltage value lower than the charge overcurrent detection voltage Vdet4.

The charge pump 30 is a booster circuit which generates a boosted control voltage Vcp by utilizing the input capacitances 1a, 1b, 2a, and 2b of the charge control transistor 1 and the discharge control transistor 2, as output capacitances of the charge pump 30. The charge pump 30 boosts the power supply voltage Vd, and generates the control voltage Vcp having a voltage value higher than the power supply voltage Vd. The charge pump 30 may have a known configuration, such as the circuit configuration proposed in Japanese Laid-Open Patent Publication No. 2005-318303, for example. For example, the charge pump 30 may generate the control voltage Vcp that is two times the power supply voltage Vd, by repeating a process of transferring the charge charged in a flying capacitor 31 by the power supply voltage Vd to the input capacitances 1a, 1b, 2a, and 2b. The flying capacitor 31 may be provided inside or may be connected externally to the battery protection circuit 10.

The driving circuit 50 uses the control voltage Vcp, to output from the COUT-terminal a signal which turns on the charge control transistor 1, and to output from the DOUT-terminal a signal which turns on the discharge control transistor 2. The driving circuit 50 supplies the control voltage Vcp to the COUT-terminal to set an output state of the COUT-terminal to a high level. On the other hand, the driving circuit 50 supplies the control voltage Vcp to the DOUT-terminal to set an output state of the DOUT-terminal to a high level.

The control circuit 40 operates the driving circuit 50, based on the detection state of the rechargeable battery 70 output from the detection circuit 20, so that the output states of the COUT-terminal and the DOUT-terminal become one of the high level, the low level, and the high-impedance state.

When an overcharge or charge overcurrent of the rechargeable battery 70 is detected by the detection circuit 20, the control circuit 40 operates the driving circuit 50 so that the output state of the COUT-terminal changes from the high level to the low level after a predetermined delay time elapses. When the output state of the COUT-terminal becomes the low level, the charge control transistor 1 turns off, and a current is prohibited from flowing in the current path 9a in a direction to charge the rechargeable battery 70. Hence, the charge of the rechargeable battery 70 stops, and the rechargeable battery 70 can be protected from the overcharge or charge overcurrent.

On the other hand, when an overdischarge or discharge overcurrent of the rechargeable battery 70 is detected by the detection circuit 20, the control circuit 40 operates the driving circuit 50 so that the output state of the DOUT-terminal changes from the high level to the low level after a predetermined delay time elapses. When the output state of the DOUT-terminal becomes the low level, the discharge control transistor 2 turns off, and a current is prohibited from flowing in the current path 9a in a direction to discharge the rechargeable battery 70. Hence, the discharge of the rechargeable battery 70 stops, and the rechargeable battery 70 can be protected from the overdischarge or discharge overcurrent.

The control circuit 40 may be formed using a plurality of analog logic circuits, without using a Central Processing Unit (CPU), for example.

Figure 4:
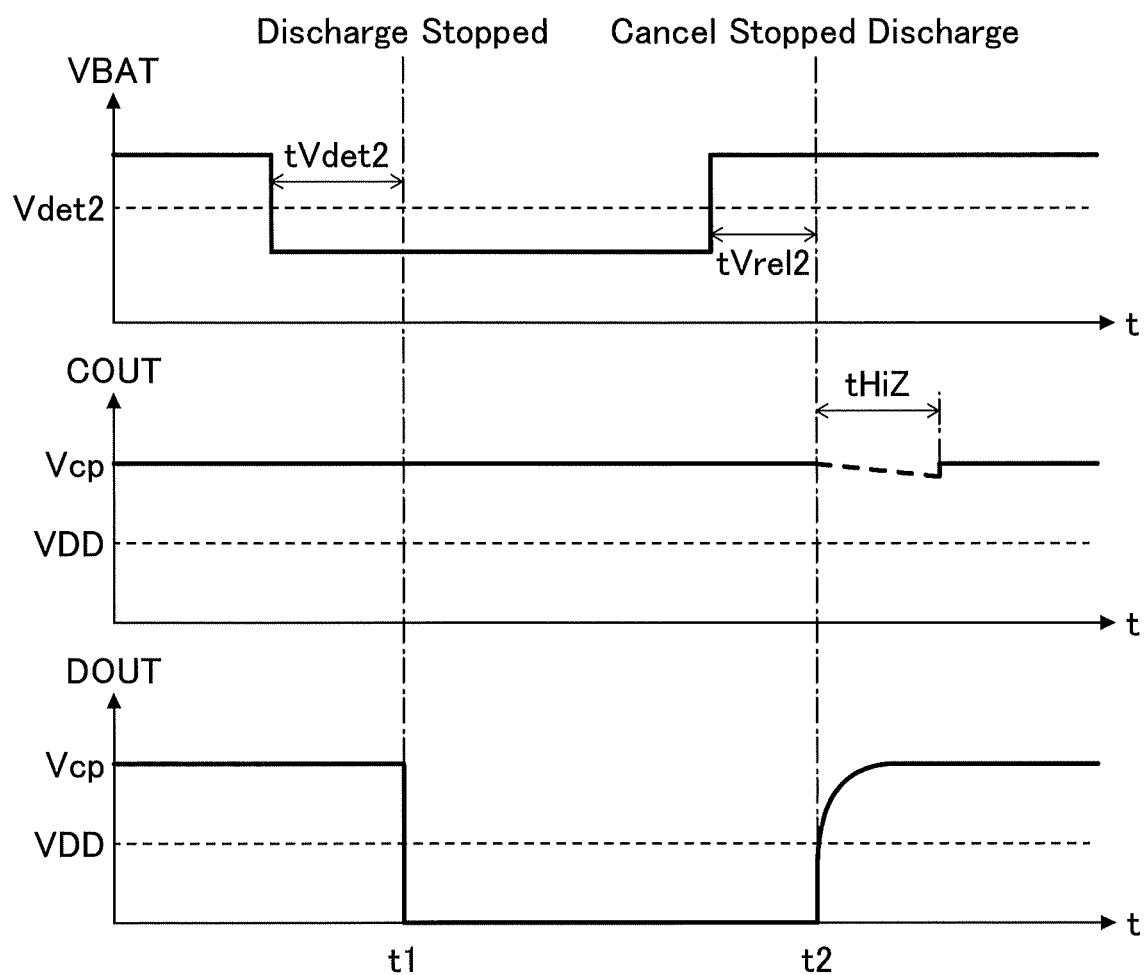
FIG. 4 is a timing chart for explaining an operation of the rechargeable battery protection circuit according to one embodiment.

FIG. 4 is a timing chart for explaining an operation of the battery protection circuit 10 illustrated in FIG. 3. FIG. 4 illustrates a process, from a time when the overdischarge of the rechargeable battery 70 is detected by the detection circuit 20 and the discharge of the rechargeable battery 70 is stopped, to a time when the return from the overdischarge of the rechargeable battery 70 is detected by the detection circuit 20 and the stopped discharge of the rechargeable battery 70 is canceled. In FIG. 4, t denotes the time in arbitrary units.

When the power supply voltage Vd (approximately equal to the cell voltage VBAT) lower than the predetermined overdischarge detection voltage Vdet2 is detected by the detection circuit 20, the control circuit 40 judges whether a predetermined overdischarge detection delay time tVdet2 has elapsed from a time when the power supply voltage Vd lower than the predetermined overdischarge detection voltage Vdet2 is detected by the detection circuit 20. When the power supply voltage Vd lower than the predetermined overdischarge detection voltage Vdet2 is continuously detected by the detection circuit 20 until the predetermined overdischarge detection delay time tVdet2 elapses, the control circuit 40 operates the driving circuit 50 so that the output state of the DOUT-terminal changes from the high level to the low level. Because the output state of the DOUT-terminal changes to the low level after a timing t1, the discharge control transistor 2 changes from the on state to the off state, and the discharge of the rechargeable battery 70 stops. In this case, the control circuit 40 operates the driving circuit 50 so that the gate of the discharge control transistor 2 is disconnected from the charge pump 30, and the charges accumulated in the input capacitances 2a and 2b of the discharge control transistor 2 are discharged to the ground.

Thereafter, when the power supply voltage Vd (approximately equal to the cell voltage VBAT) higher than the predetermined overdischarge return voltage Vrel2 is detected by the detection circuit 20, the control circuit 40 judges whether a predetermined overdischarge return delay time tVrel2 has elapsed from a time when the power supply voltage Vd higher than the predetermined overdischarge return voltage Vrel2 is detected by the detection circuit 20. When the power supply voltage Vd higher than the predetermined overdischarge return voltage Vrel2 is continuously detected by the detection circuit 20 until the predetermined overdischarge return delay time tVrel2 elapses, the control circuit 40 operates the driving circuit 50 so that the output state of the DOUT-terminal changes from the low level to the high level. Because the output state of the DOUT-terminal changes to the high level after a timing t2, the discharge control transistor 2 changes from the off state to the on state, and the stopped discharge of the rechargeable battery 70 is canceled. In this case, the control circuit 40 operates the driving circuit 50 so that the gate of the discharge control transistor 2 is reconnected to the charge pump 30, and the charges accumulated in the input capacitances 2a and 2b of the discharge control transistor 2 are charged by the control voltage Vcp.

The control circuit 40 according to this embodiment operates the driving circuit 50, so that the output state of the COUT-terminal temporarily switches from the high level to the high-impedance state when the output state of the DOUT-terminal switches from the low level to the high level (at the timing t2). For example, the control circuit 40 operates the driving circuit 50, so that an internal path through which the charge from the COUT-terminal is transferred to the DOUT-terminal is cut off. By operating the driving circuit 40 in this manner, it is possible to prohibit the charges accumulated in the input capacitances 1a and 1b of the charge control transistor 1 from being transferred to the input capacitances 2a and 2b of the discharge control transistor 2.

When the COUT-terminal is temporarily in the high-impedance state, the high level of the COUT-terminal is maintained by the input capacitances 1a and 1b of the charge control transistor 1, and the charge control transistor 1 is maintained in the on state. In other words, the gate-source voltage of the charge control transistor 1 is maintained to a state higher than a threshold voltage of the charge control transistor 1. Even when the COUT-terminal is temporarily in the high-impedance state, the voltage at the COUT-terminal gradually drops due to a gate current leak of the charge control transistor 1, and a terminal current leak of the COUT-terminal. However, it is sufficient as long as the voltage at the COUT-terminal is maintained at the high level for several milliseconds until the voltage at the DOUT-terminal rises to the high level. A time (hereinafter also referred to as "high-impedance time tHiZ") it takes to return the output state of the COUT-terminal to the high level from a time when the output state of the COUT-terminal is switched to the high-impedance state, may be a fixed value or a variable value.

Figure 5:
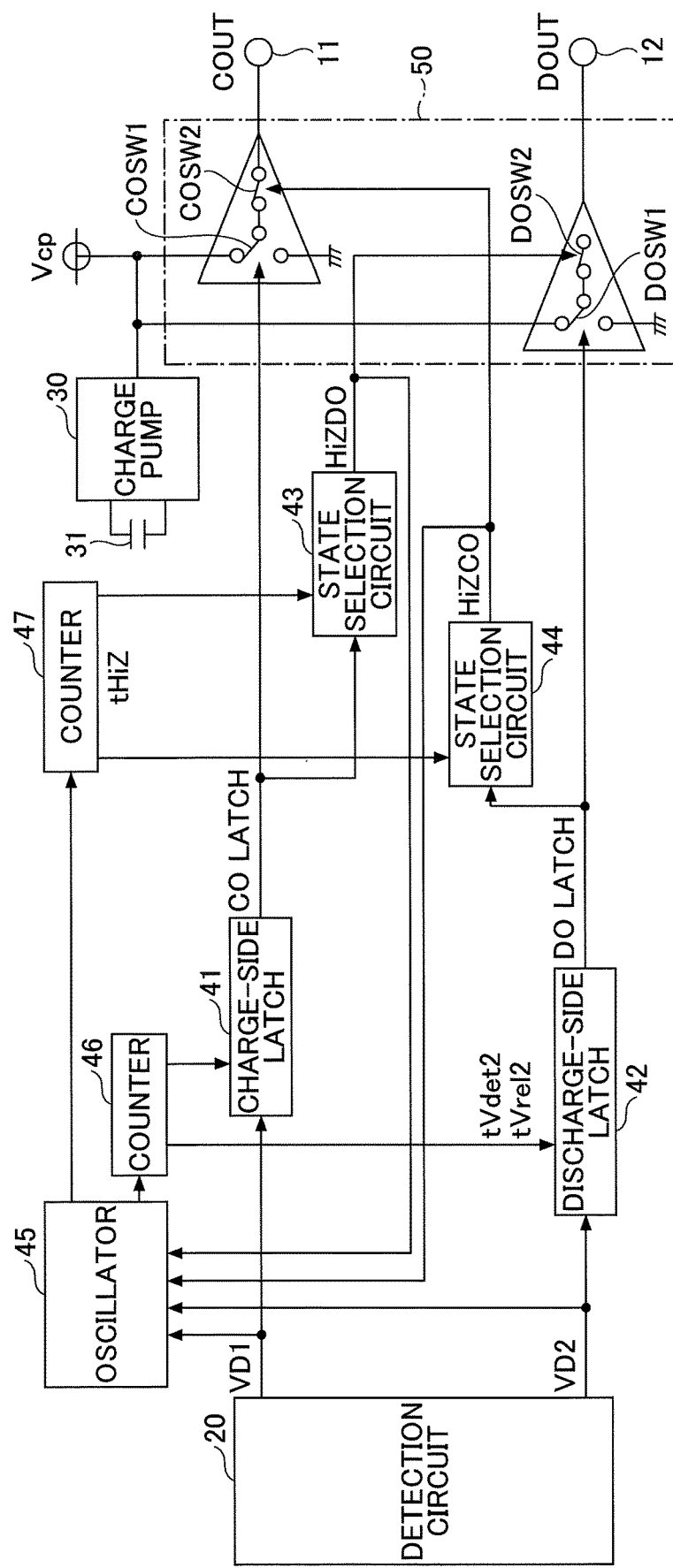
FIG. 5 is a block diagram illustrating a configuration of a control circuit.

FIG. 5 is a block diagram illustrating a configuration of the control circuit. The control circuit 40 illustrated in FIG. 5 includes a charge-side latch 41, a discharge-side latch 42, a state selection circuit 43, a state selection circuit 44, an oscillator 45, and counters 46 and 47. The driving circuit 50 includes switches COSW1 and COSW2 for switching the output state of the COUT-terminal, and switches DOSW1 and DOSW2 for switching the output state of the DOUT-terminal.

A signal VD1 is a signal indicating whether the overcharge of the rechargeable battery 70 is detected by the detection circuit 20, and in this example, a detection state is indicated by a high level, and a non-detection state is indicated by a low level. The counter 46 counts a clock signal having a constant period and output from the oscillator 45, to judge the lapse of the overcharge detection delay time tVdet1 and the overcharge return delay time tVrel1. The charge-side latch 41 switches an output signal COLATCH from a high level to a low level, after the overcharge detection delay time tVdet1 elapses from a time when the signal VD1 switches from a low level to a high level. The charge-side latch 41 switches the output signal COLATCH from the low level to the high level, after the overdischarge return delay time tVrel2 elapses from a time when the signal VD1 switches from the high level to the low level.

The signal VD1 may be a signal that indicates whether the detection circuit 20 is detecting the charge overcurrent of the rechargeable battery 70, and in this case, the detection state is indicated by a high level, and the non-detection state is indicated by a low level. The counter 46 counts the clock signal having the constant period and output from the oscillator 45, to judge the lapse of the charge overcurrent detection delay time tVdet4 and the charge overcurrent return delay time tVrel4. The charge-side latch 41 switches the output signal COLATCH from the high level to the low level, after the charge overcurrent detection delay time tVdet4 elapses from a time when the signal VD1 switches from the low level to the high level. The charge-side latch 41 switches the output signal COLATCH from the low level to the high level, after the charge overcurrent return delay time tVrel4 elapses from a time when the signal VD1 switches from the high level to the low level.

Figure 6:
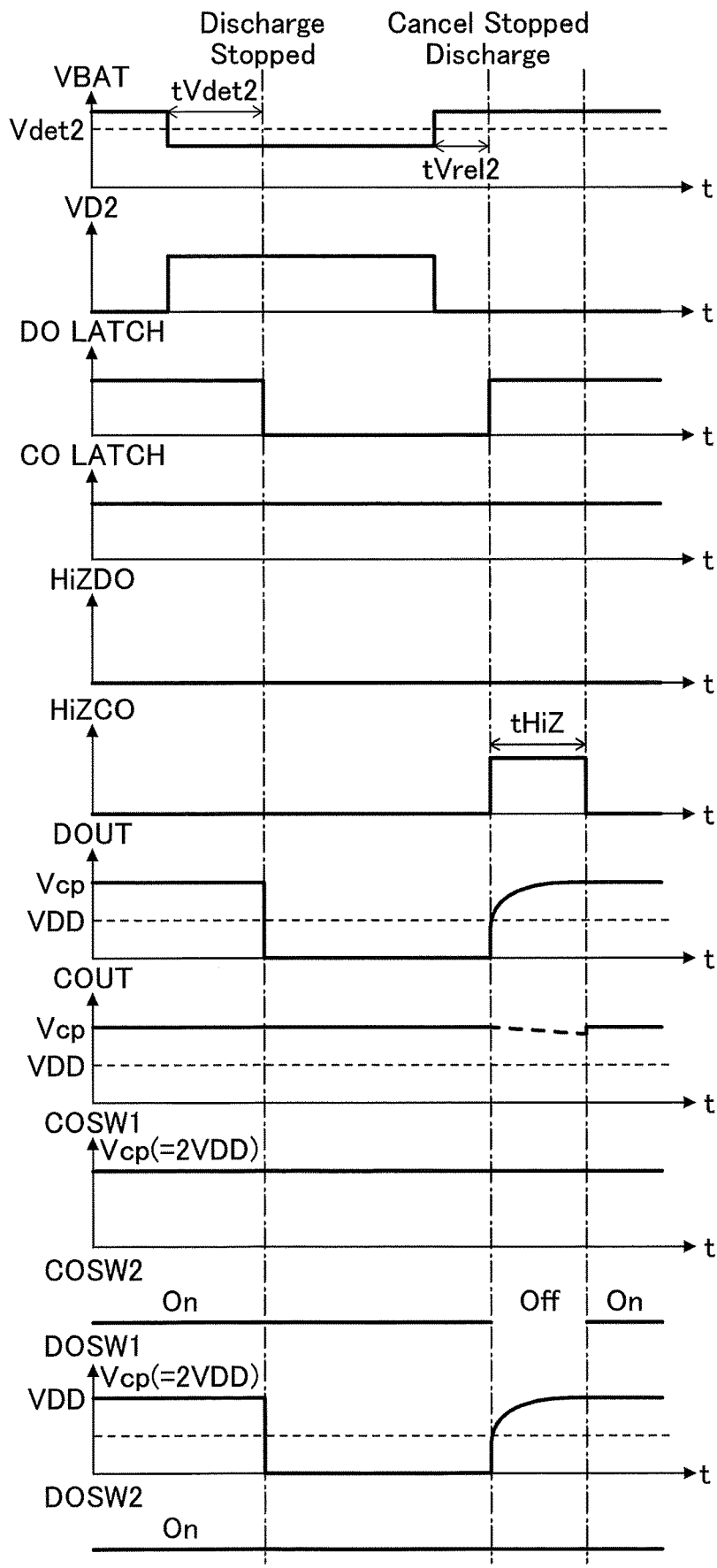
FIG. 6 is a timing chart for explaining the operation of the rechargeable battery protection circuit according to one embodiment in more detail.

When the output signal COLATCH has the high level, an output level of the switch COSW1 is the control voltage Vcp (high level) as illustrated in FIG. 6 which will be described later. When the output signal COLATCH has the low level, the output level of the switch COSW1 is the ground voltage (low level) as illustrated in FIG. 6 which will be described later.

The counter 47 counts the clock signal having the constant period and output from the oscillator 45, to judge the lapse of a time (that is, a high-impedance time tHiZ) from a time when the output state of the DOUT-terminal is switched to the high-impedance state to a time when the output state returns to the high level. When the output signal COLATCH switches from the low level to the high level, the state selection circuit 43 switches an output signal HiZDO from a low level to a high level, and switches the output signal HiZDO from the high level to the low level after the high-impedance time tHiZ elapses.

When the output signal HiZDO is at the low level, the switch DOSW2 turns on as will be described in conjunction with FIG. 6, and the switch DOSW1 and the DOUT-terminal become connected. When the output signal HiZDO is at the high level, the switch DOSW2 turns off, and the switch DOSW1 and the DOUT-terminal become disconnected.

A signal VD2 is a signal indicating whether the overdischarge of the rechargeable battery 70 is detected by the detection circuit 20, and in this example, a detection state is indicated by a high level, and a non-detection state is indicated by a low level. The counter 46 counts the clock signal having the constant period and output from the oscillator 45, to judge the lapse of the overdischarge detection delay time tVdet2 and the overdischarge return delay time tVrel2. The discharge-side latch 42 switches an output signal DOLATCH from a high level to a low level, after the overdischarge detection delay time tVdet2 elapses from a time when the signal VD2 switches from a low level to a high level. The discharge-side latch 42 switches the output signal DOLATCH from the low level to the high level, after the overdischarge return delay time tVrel2 elapses from a time when the signal VD2 switches from the high level to the low level.

The signal VD2 may be a signal that indicates whether the detection circuit 20 is detecting the discharge overcurrent of the rechargeable battery 70, and in this case, the detection state is indicated by a high level, and the non-detection state is indicated by a low level. The counter 46 counts the clock signal having the constant period and output from the oscillator 45, to judge the lapse of the discharge overcurrent detection delay time tVdet3 and the discharge overcurrent return delay time tVrel3. The discharge-side latch 42 switches the output signal DOLATCH from the high level to the low level, after the discharge overcurrent detection delay time tVdet3 elapses from a time when the signal VD2 switches from the low level to the high level. The discharge-side latch 42 switches the output signal DOLATCH from the low level to the high level, after the discharge overcurrent return delay time tVrel3 elapses from a time when the signal VD2 switches from the high level to the low level.

When the output signal DOLATCH has the high level, an output level of the switch DOSW1 is the control voltage Vcp (high level) as illustrated in FIG. 6 which will be described later. When the output signal DOLATCH has the low level, the output level of the switch DOSW1 is the ground voltage (low level).

The counter 47 counts the clock signal having the constant period and output from the oscillator 45, to judge the lapse of a time (that is, the high-impedance time tHiZ) from a time when the output state of the COUT-terminal is switched to the high-impedance state to a time when the output state returns to the high level. When the output signal DOLATCH switches from the low level to the high level, the state selection circuit 44 switches an output signal HiZCO from a low level to a high level, and switches the output signal HiZCO from the high level to the low level after the high-impedance time tHiZ elapses.

When the output signal HiZCO is at the low level, the switch COSW2 turns on as will be described in conjunction with FIG. 6, and the switch COSW1 and the COUT-terminal become connected. When the output signal HiZCO is at the high level, the switch COSW2 turns off, and the switch COSW1 and the COUT-terminal become disconnected.

FIG. 6 is a timing chart for explaining the operation of the battery protection circuit 10 according to one embodiment in more detail. FIG. 6 illustrates the process, from the time when the overdischarge of the rechargeable battery 70 is detected by the detection circuit 20 and the discharge of the rechargeable battery 70 is stopped, to the time when the return from the overdischarge of the rechargeable battery 70 is detected by the detection circuit 20 and the stopped discharge of the rechargeable battery 70 is canceled. In FIG. 6, t denotes the time in arbitrary units. The process illustrated in FIG. 6 will be described by referring to FIG. 5.

The overdischarge detection delay time tVdet2 and the overdischarge return delay time tVrel2 are generated by the oscillator 45 and the counter 46. The counter 46 counts the clock signal having the constant period and output from the oscillator 45, to judge the lapse of the overdischarge detection delay time tVdet2 and the overdischarge return delay time tVrel2.

The signal VD2 is a signal indicating whether the overdischarge of the rechargeable battery 70 is detected by the detection circuit 20, and in this example, a detection state is indicated by a high level, and a non-detection state is indicated by a low level.

The output signal DOLATCH switches from the high level to the low level, after the overdischarge detection delay time tVdet2 elapses from the time when the signal VD2 switches from the low level to the high level. The output signal DOLATCH switches from the low level to the high level, after the overdischarge return delay time tVrel2 elapses from the time when the signal VD2 switches from the high level to the low level.

The output signal COLATCH is at the high level, because no overcharge nor charge overcurrent is detected. When the output signal COLATCH is at the high level, the output level of the switch COSW1 is the control voltage Vcp (high level).

The output signal HiZDO is at the low level, because no overcharge nor charge overcurrent is detected. When the output signal HiZCO is at the low level, the switch DOSW2 turns on, and the switch DOSW1 and the DOUT-terminal become connected.

The output signal HiZCO switches from the low level to the high level, when the output signal DOLATCH switches from the low level to the high level. During the high-level period (that is, the high-impedance time tHiZ) of the output signal HiZCO, the switch COSW2 is off, and the COUT-terminal is in the high-impedance state. After the high-impedance time tHiZ elapses, the output signal HiZCO switches from the high level to the low level.

The DOUT-terminal switches from the control voltage Vcp (high level) to the ground voltage (low level), when the output signal DOLATCH switches from the high level to the low level. The DOUT-terminal switches from the ground voltage (low level) to the control voltage Vcp (high level), when the output signal DOLATCH switches from the low level to the high level.

The COUT-terminal is in the high-impedance state during the high-level period (that is, the high-impedance time tHiZ) of the output signal HiZCO. Because the COUT-terminal is maintained at the high level by the input capacitances of the charge control transistor 1, the charge control transistor 1 is maintained in the on state.

According to this embodiment, by setting the output state of the COUT-terminal to the high-impedance state, it is possible to prevent the charge accumulated in each input capacitance of the charge control transistor 1 from transferring to each input capacitance of the discharge control transistor 2. For this reason, it is possible to prevent the unintended operation (that is, the instantaneous off operation) of the charge control transistor 1.

FIG. 4 through FIG. 6 illustrate that the unintended operation (that is, the instantaneous off operation) of the charge control transistor 1, that occurs when the output state of the DOUT-terminal changes from the low level to the high level due to detection of the return from the overdischarge of the rechargeable battery 70, can be prevented. However, according to the configuration described above, the unintended operation (that is, the instantaneous off operation) of the charge control transistor 1, that occurs when the output state of the DOUT-terminal changes from the low level to the high level due to detection of the return from the discharge overcurrent of the rechargeable battery 70, can also be prevented. Further, according to the configuration described above, the unintended operation (that is, the instantaneous off operation) of the charge control transistor 2, that occurs when the output state of the COUT-terminal changes from the low level to the high level due to detection of the return from the overcharge or the charge overcurrent of the rechargeable battery 70, can also be prevented.

The high-impedance time tHiZ may be a fixed value (for example, 2 milliseconds or the like), or may be a variable value. When the control circuit 40 is configured to vary the high-impedance time tHiZ, the high-impedance time tHiZ can be finely adjusted according to changes in the transistors 1 and 2 that are used, or individual differences in the characteristics of the transistors 1 and 2 that are used. On the other hand, when the high-impedance time tHiZ is a fixed value, it is possible to reduce circuit scale enlargement of the battery protection circuit 10.

Figure 7:
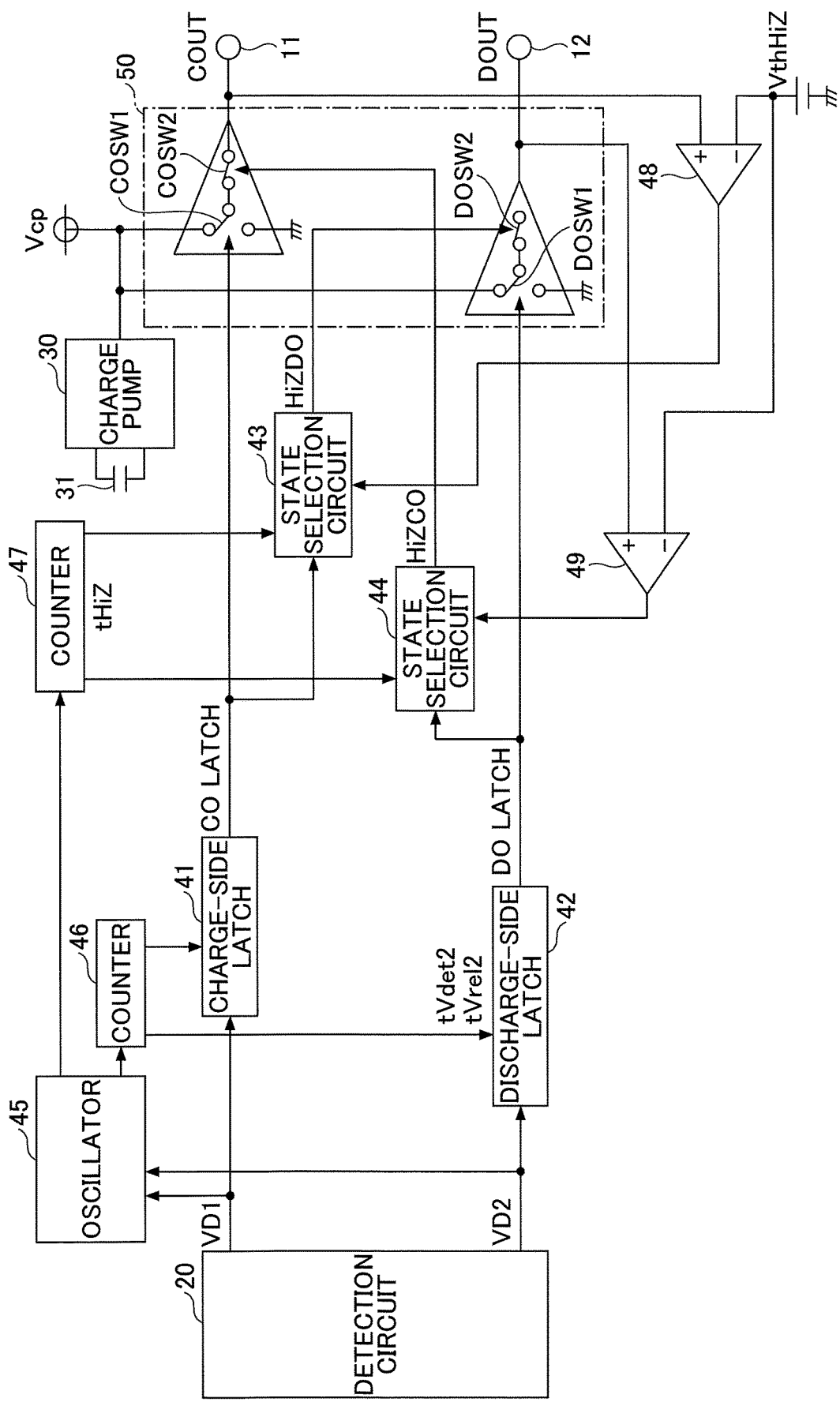
FIG. 7 is a diagram illustrating an example of the configuration of the control circuit including adjustment circuits for adjusting a high-impedance time.

FIG. 7 is a diagram illustrating an example of the configuration of the control circuit including adjustment circuits for adjusting the high-impedance time tHiZ. In FIG. 7, those parts that are the same as those corresponding part in FIG. 5 are designated by the same reference numerals, and a description thereof will be omitted. Adjustment circuits 48 and 49 respectively monitor the terminal voltages of the DOUT-terminal and the COUT-terminal, and cancels the high-impedance state when the terminal voltage that is greater than or equal to a threshold value VthHiZ is detected. When the terminal voltage of the COUT-terminal greater than or equal to the threshold value VthHiZ is detected, the adjustment circuit 48 judges that the terminal voltage of the COUT-terminal has risen to a sufficiently large value, switches the switch DOSW2 from an off state to an on state, and returns the output state of the DOUT-terminal from the high-impedance state to the high level. When the terminal voltage of the DOUT-terminal greater than or equal to the threshold value VthHiZ is detected, the adjustment circuit 49 judges that the terminal voltage of the DOUT-terminal has risen to a sufficiently large value, switches the switch COSW2 from an off state to an on state, and returns the output state of the COUT-terminal from the high-impedance state to the high level.

Figure 8:
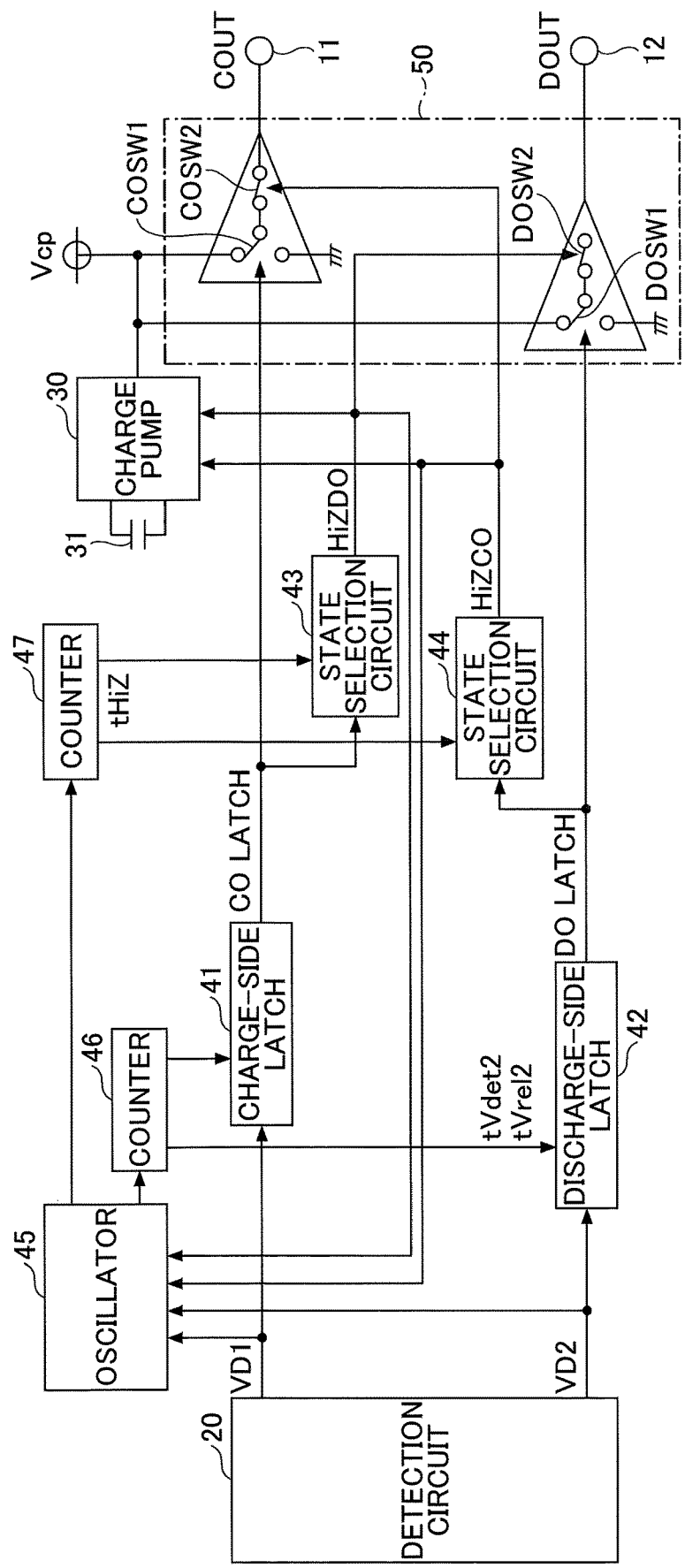
FIG. 8 is a block diagram illustrating the configuration of the control circuit.

FIG. 8 is a block diagram illustrating the configuration of the control circuit. In FIG. 8, those parts that are the same as those corresponding parts in FIG. 5 are designated by the same reference numerals, and a description thereof will be omitted. In FIG. 8, the output signals HiZCO and HiZDO are input to the charge pump 30. The charge pump 30 increases the switching speed for boosting during a time (that is, a time in which the high-level output signal HiZCO or HiZDO is input) in which one of the COUT-terminal and the DOUT-terminal is in the high-impedance state. Hence, the control voltage Vcp, which instantaneously drops, rapidly rises, and thus, the setting value of the high-impedance time tHiZ can be shortened.

In addition, when the output state of each of the COUT-terminal and the DOUT-terminal is the low level, the gate-source voltage of each of the transistors 1 and 2 need only be lower than the threshold voltage of each of the transistors 1 and 2. For this reason, the terminal voltage of each of the COUT-terminal and the DOUT-terminal when the output state of each of the COUT-terminal and the DOUT-terminal is the low level, is not limited to the voltage (ground voltage) of the VSS terminal. For example, when the voltage of the COUT-terminal is the voltage (power supply voltage Vd) of the VDD terminal, the charge control transistor 1 turns off, and the terminal voltage when the output state of the COUT-terminal is the low level may be the same voltage (power supply voltage Vd) as the VDD terminal. In addition, when the voltage of the DOUT-terminal is the voltage of the V+ terminal, the discharge control transistor 2 turns off, and the terminal voltage when the output state of the DOUT-terminal is the low level may be the same voltage as the V+ terminal.

Further, the driving circuit 50 includes a driving buffer which selectively outputs one of three logical states (that is, the high level, the low level, and the high-impedance state) to the COUT-terminal, and a driving buffer which selectively outputs one of three logical states (that is, the high level, the low level, and the high-impedance state) to the DOUT-terminal.

Figure 9:
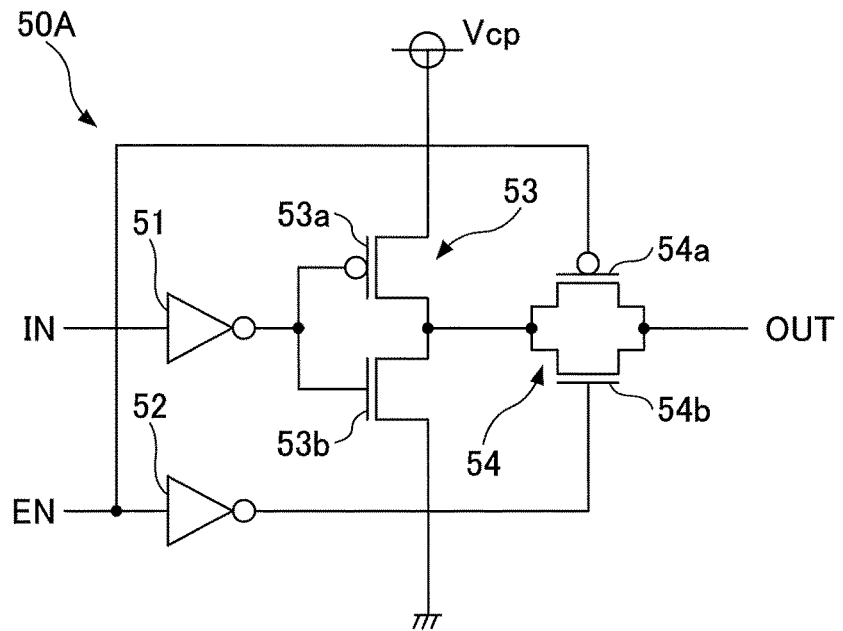
FIG. 9 is a diagram illustrating a first configuration example of a driving buffer of a driving circuit.
Figure 10:
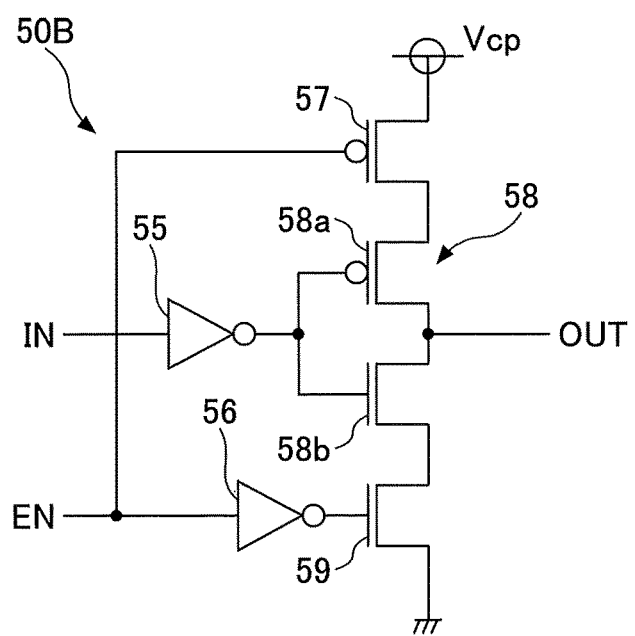
FIG. 10 is a diagram illustrating a second configuration example of the driving buffer of the driving circuit.
Figures 11, 12, 13:
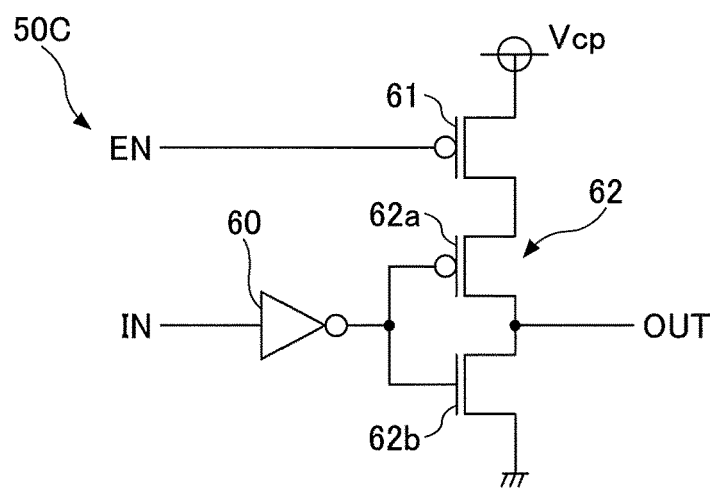
FIG. 11 illustrates a truth table of the driving buffers illustrated in FIG. 9 and FIG. 10.
FIG. 12 is a diagram illustrating a third configuration example of the driving buffer of the driving circuit.
FIG. 13 illustrates a truth table of the driving buffer illustrated in FIG. 12.

FIG. 9 is a diagram illustrating a first configuration example of the driving buffer of the driving circuit. FIG. 10 is a diagram illustrating a second configuration example of the driving buffer of the driving circuit. FIG. 11 illustrates a truth table of the driving buffers illustrated in FIG. 9 and FIG. 10. In the truth table, "0", "1", and "HiZ" respectively indicate the low level, the high level, and the high-impedance state.

A driving buffer 50A illustrated in FIG. 9 includes logical inverter circuits 51 and 52 which output inverted logical states of input logical states, a Complementary Metal Oxide Semiconductor (CMOS) inverter 53, and a transmission gate 54. The CMOS inverter 53 includes a P-channel Metal Oxide Semiconductor (PMOS) transistor 53a and a NMOS transistor 53b. The transmission gate 54 includes a PMOS transistor 54a and a NMOS transistor 54b.

A driving buffer 50B illustrated in FIG. 10 includes logical inverter circuits 55 and 56 which output inverted logical states of input logical states, a CMOS inverter 58, a PMOS transistor 57, and a NMOS transistor 59. The CMOS inverter 58 includes a PMOS transistor 58a and a NMOS transistor 58b. The CMOS inverter 58 is cut off from the control voltage Vcp (high-level voltage) when the PMOS transistor 57 turns off, and is cut off from the ground (low-level voltage) when the NMOS transistor 59 turns off.

In this embodiment, the high-impedance state occurs only when an input IN has the high level, and thus, the driving buffer 50B illustrated in FIG. 10 may be modified into a configuration illustrated in FIG. 12. FIG. 12 is a diagram illustrating a third configuration example of the driving buffer of the driving circuit. FIG. 13 illustrates a truth table of the driving buffer illustrated in FIG. 12. A driving buffer 50C illustrated in FIG. 12 includes a logical inverter circuit 60 which outputs an inverted logical state of an input logical state, a PMOS transistor 61, and a CMOS inverter 62. The CMOS inverter 62 includes a PMOS transistor 62a and a NMOS transistor 62b. The CMOS inverter 62 is cut off from the control voltage Vcp (high-level voltage) when the PMOS transistor 61 turns off.

According to this embodiment, the output state of each of the COUT-terminal and the DOUT-terminal can be set to the high-impedance state, and for this reason, it is possible to prevent the unintended operation of the transistors 1 and 2 caused by the discharge of the charges from the input capacitances.

Hence, the embodiments described above can prevent an unintended operation of the NMOS transistor.

Although the configuration examples are numbered with, for example, "first," "second," "third," etc., the ordinal numbers do not imply priorities of the configuration examples.

Further, the present invention is not limited to these embodiments, but various variations, modifications, and substitutions of a part or all of the embodiments may be made without departing from the scope of the present invention.

For example, layout positions of the charge control transistor 1 and the discharge control transistor 2 may be mutually interchanged from the layout positions illustrated in FIG. 3.

What is claimed is:

1. A rechargeable battery protection circuit which protects a rechargeable battery, using a first NMOS transistor and a second NMOS transistor inserted in series in a current path between a cathode of the rechargeable battery and a positive terminal that is coupled to a load or a power terminal of a charger, the rechargeable battery protection circuit comprising:
   a charge control terminal directly connected to a gate of the first NMOS transistor;
   a discharge control terminal directly connected to a gate of the second NMOS transistor;
   a booster circuit configured to generate a control voltage that is boosted, using each of input capacitances of the first NMOS transistor and the second NMOS transistor;
   a driving circuit configured to set each of output states of the charge control terminal and the discharge control terminal to a high level, by supplying the control voltage to the charge control terminal and the discharge control terminal;
   a detection circuit configured to detect a state of the rechargeable battery, and output a detection state; and
   a control circuit configured to operate the driving circuit based on the detection state, so that each of the output states of the charge control terminal and the discharge control terminal is selectable by the driving circuit to a high-impedance state, in addition to being selectable by the driving circuit to the high level and a low level.

2. The rechargeable battery protection circuit as claimed in claim 1, wherein the control circuit, when switching the output state of one of the charge control terminal and the discharge control terminal from the low level to the high level, temporarily switches the output state of the other of the charge control terminal and the discharge control terminal from the high level to the high-impedance state.

3. The rechargeable battery protection circuit as claimed in claim 2, wherein the control circuit varies a time it takes to return the output state of the other of the charge control terminal and the discharge control terminal to the high level from a time when the output state of the other of the charge control terminal and the discharge control terminal is switched to the high-impedance state.

4. The rechargeable battery protection circuit as claimed in claim 1, wherein the control circuit, when switching the output state of the discharge control terminal from the low level to the high level, operates the driving circuit to temporarily switch the output state of the charge control terminal from the high level to the high-impedance state, thereby temporarily cutting off an internal path through which a charge is transferrable from the charge control terminal to the discharge control terminal.

5. A rechargeable battery protection device comprising:
   a first NMOS transistor inserted in series in a current path between a cathode of a rechargeable battery and a positive terminal that is coupled to a load or a power terminal of a charger;
   a second NMOS transistor inserted in series in the current path; and
   a rechargeable battery protection circuit configured to protect the rechargeable battery, using the first NMOS transistor and the second NMOS transistor,
   wherein the rechargeable battery protection circuit includes a charge control terminal directly connected to a gate of the first NMOS transistor;

a discharge control terminal directly connected to a gate of the second NMOS transistor;

a booster circuit configured to generate a control voltage that is boosted, using each of input capacitances of the first NMOS transistor and the second NMOS transistor;

a driving circuit configured to set each of output states of the charge control terminal and the discharge control terminal to a high level, by supplying the control voltage to the charge control terminal and the discharge control terminal;

a detection circuit configured to detect a state of the rechargeable battery, and output a detection state; and a control circuit configured to operate the driving circuit based on the detection state, so that each of the output states of the charge control terminal and the discharge control terminal is selectable by the driving circuit to a high-impedance state, in addition to being selectable by the driving circuit to the high level and a low level.

6. The rechargeable battery protection device as claimed in claim 5, wherein the control circuit of the rechargeable battery protection circuit, when switching the output state of one of the charge control terminal and the discharge control terminal from the low level to the high level, temporarily switches the output state of the other of the charge control terminal and the discharge control terminal from the high level to the high-impedance state.

7. The rechargeable battery protection device as claimed in claim 6, wherein the control circuit of the rechargeable battery protection circuit varies a time it takes to return the output state of the other of the charge control terminal and the discharge control terminal to the high level from a time when the output state of the other of the charge control terminal and the discharge control terminal is switched to the high-impedance state.

8. The rechargeable battery protection device as claimed in claim 5, wherein the control circuit of the rechargeable battery protection circuit, when switching the output state of the discharge control terminal from the low level to the high level, operates the driving circuit of the rechargeable battery protection circuit to temporarily switch the output state of the charge control terminal from the high level to the high-impedance state, thereby temporarily prohibiting charges accumulated in the input capacitances of the first NMOS transistor from being transferred to the input capacitances of the second NMOS transistor.

9. A battery pack comprising:
a first NMOS transistor inserted in series in a current path between a cathode of a rechargeable battery and a positive terminal that is coupled to a load or a power terminal of a charger;
a second NMOS transistor inserted in series in the current path; and
a rechargeable battery protection circuit configured to protect the rechargeable battery, using the first NMOS transistor and the second NMOS transistor,
wherein the rechargeable battery protection circuit includes
a charge control terminal directly connected to a gate of the first NMOS transistor;
a discharge control terminal directly connected to a gate of the second NMOS transistor;
a booster circuit configured to generate a control voltage that is boosted, using each of input capacitances of the first NMOS transistor and the second NMOS transistor;

a driving circuit configured to set each of output states of the charge control terminal and the discharge control terminal to a high level, by supplying the control voltage to the charge control terminal and the discharge control terminal;

a detection circuit configured to detect a state of the rechargeable battery, and output a detection state; and a control circuit configured to operate the driving circuit based on the detection state, so that each of the output states of the charge control terminal and the discharge control terminal is selectable by the driving circuit to a high-impedance state, in addition to being selectable by the driving circuit to the high level and a low level.

10. The battery pack as claimed in claim 9, wherein the control circuit of the rechargeable battery protection circuit, when switching the output state of one of the charge control terminal and the discharge control terminal from the low level to the high level, temporarily switches the output state of the other of the charge control terminal and the discharge control terminal from the high level to the high-impedance state.

11. The battery pack as claimed in claim 10, wherein the control circuit of the rechargeable battery protection circuit varies a time it takes to return the output state of the other of the charge control terminal and the discharge control terminal to the high level from a time when the output state of the other of the charge control terminal and the discharge control terminal is switched to the high-impedance state.

12. The battery pack as claimed in claim 9, wherein the control circuit of the rechargeable battery protection circuit, when switching the output state of the discharge control terminal from the low level to the high level, operates the driving circuit of the rechargeable battery protection circuit to temporarily switch the output state of the charge control terminal from the high level to the high-impedance state, thereby temporarily prohibiting charges accumulated in the input capacitances of the first NMOS transistor from being transferred to the input capacitances of the second NMOS transistor.

13. A method of controlling a rechargeable battery protection circuit which protects a rechargeable battery, using a first NMOS transistor and a second NMOS transistor inserted in series in a current path between a cathode of the rechargeable battery and a positive terminal that is coupled to a load or a power terminal of a charger,
wherein the rechargeable battery protection circuit includes
a charge control terminal directly connected to a gate of the first NMOS transistor;
a discharge control terminal directly connected to a gate of the second NMOS transistor;
a booster circuit configured to generate a control voltage that is boosted, using each of input capacitances of the first NMOS transistor and the second NMOS transistor;
a driving circuit configured to set each of output states of the charge control terminal and the discharge control terminal to a high level, by supplying the control voltage to the charge control terminal and the discharge control terminal; and a detection circuit configured to detect a state of the rechargeable battery, and output a detection state, the method comprising:

operating the driving circuit based on the detection state, so that each of the output states of the charge control terminal and the discharge control terminal is selectable by the driving circuit to a high-impedance state, in addition to being selectable by the driving circuit to the high level and a low level.

14. The method of controlling the rechargeable battery protection circuit as claimed in claim 13, further comprising;

when switching the output state of one of the charge control terminal and the discharge control terminal from the low level to the high level, temporarily switching the output state of the other of the charge control terminal and the discharge control terminal from the high level to the high-impedance state.

15. The method of controlling the rechargeable battery protection circuit as claimed in claim 14, further comprising:

varying a time it takes to return the output state of the other of the charge control terminal and the discharge control terminal to the high level from a time when the output state of the other of the charge control terminal and the discharge control terminal is switched to the high-impedance state.

* * * * *